United States Patent [19]

Suzuki et al.

[11] Patent Number: 4,661,417
[45] Date of Patent: Apr. 28, 1987

[54] COMPOSITE OF METAL AND RESIN HAVING ELECTROLYTICALLY REDUCED METAL LAYER AND PROCESS FOR PRODUCING THE SAME

[75] Inventors: Yoshihiro Suzuki, Hitachi; Nobuhiro Satoh, Mito; Motoyo Wajima, Hitachi; Toshikazu Narahara, Ibaraki; Takeshi Shimazaki, Hadano, all of Japan

[73] Assignee: Hitachi, Ltd., Tokyo, Japan

[21] Appl. No.: 687,754

[22] Filed: Dec. 31, 1984

[30] Foreign Application Priority Data

Dec. 29, 1983 [JP] Japan .................... 58-247980
Dec. 29, 1983 [JP] Japan .................... 58-247981
Oct. 17, 1984 [JP] Japan .................... 59-216211

[51] Int. Cl.$^4$ .................................... B32B 15/08
[52] U.S. Cl. ............................ 428/607; 428/612; 428/626; 428/675
[58] Field of Search ........... 428/612, 626, 675, 607, 428/687; 204/35.1, 140

[56] References Cited

U.S. PATENT DOCUMENTS

| Re. 30,180 | 12/1979 | Wolski et al. | 428/612 |
| 3,220,897 | 11/1965 | Conley et al. | 428/611 |
| 3,293,109 | 12/1966 | Luce et al. | 428/637 |
| 3,918,926 | 11/1975 | Wolski et al. | 428/612 |
| 4,311,768 | 1/1982 | Berdan et al. | 428/626 |
| 4,496,794 | 1/1985 | Darms et al. | 174/68.5 |
| 4,517,254 | 5/1985 | Grapentin et al. | 428/626 |

FOREIGN PATENT DOCUMENTS

| EP48221 | 9/1981 | European Pat. Off. |  |
| 2754248 | 6/1979 | Fed. Rep. of Germany | 428/626 |
| 56-35497 | 8/1981 | Japan |  |

Primary Examiner—L. Dewayne Rutledge
Assistant Examiner—John J. Zimmerman
Attorney, Agent, or Firm—Antonelli, Terry & Wands

[57] ABSTRACT

A composite of metal and resin comprising a resin layer and a metal layer having a surface roughness of a degree giving a lusterless appearance and a color of olive brown to black closely adhered through said surface to the resin layer is excellent in adhesive strength between the metal and resin layers, the metal layer being excellent in acid resistance, and is suitable for producing printed circuit boards.

40 Claims, 23 Drawing Figures

COMPOSITE OF METAL AND RESIN HAVING ELECTROLYTICALLY REDUCED METAL LAYER AND PROCESS FOR PRODUCING THE SAME

BACKGROUND OF THE INVENTION

This invention relates to a composite of metal and resin and a process for producing the same. More particularly, it relates to a composite of metal and resin which is suitable to be used as a substrate for a printed circuit board and a process for producing the same.

Regarding the adhesion of metals to resins, various methods have hitherto been studied for surface-treatment of metals in order to enhance the adhesive strength between metals and resins. For example, there is known a method which comprises etching the surface of a metal by mechanical means or by means of an oxidizing agent in an acid solution to roughen the surface, then forming an oxidized film on the metal surface frequently in alkaline solution or, even when in acid solution, by utilizing the increase of pH at the surface of the metal due to the reaction of the metal surface with the solution, and then adhering the metal to a resin through the intermediation of the oxidized film. In the case of copper, for example, the surface of metallic copper is roughened by means of etching using an aqueous solution containing cupric chloride and hydrochloric acid as the acid solution, and then an oxidized copper film is formed on the copper surface by using an alkaline solution containing chlorous acid, phosphoric acid, and sodium hydroxide, and the metal is adhered to a resin through the oxidized film at room temperature, or with heating, or with heating under application of pressure. As to the methods for forming an oxidized film on the metal surface, there may also be mentioned a method to conduct the oxidation treatment by using a solution containing potassium permanganate and sodium hydroxide. The oxidized film may also be formed by ultraviolet irradiation or flame treatment. Further, when iron metal is immersed in phosphoric acid, it is oxidized by phosphoric acid and the pH at the surface of iron is elevated as the result of hydrogen generation, whereby a stable phosphate of iron is formed on the iron surface. As a result, resins come to adhere to metals with a high adhesive strength through these metal oxides or metal salts. However, these metal oxides or metal salts have a defect of having poor resistance to acids. The metal-resin composites are frequently used in an atmosphere where contact with acids may take place. Accordingly, the adhesion in the metal-resin composites is desirably not only mechanically strong but also chemically stable.

As to the method for improving the adhesive property of copper coatings, there are known techniques disclosed in Japanese Patent Application Kokai (Laid-Open) Nos. 35497/81 and 177593/82. Both of these disclose a technique wherein copper coating is first oxidized and then the copper oxide is reduced under a high-temperature reducing atmosphere until the luster of pure copper appears, whereby a pure metal surface is obtained. Particularly, the latter publication discloses to resolve the problem of brittleness due to polycrystalline fine particles by excluding these particles. That is to say, it is described that when copper metal is rendered to have a lustrous surface having no fine particle, it can form a laminate of high peeling strength. According to the investigation of the present inventors, however, neither of the techniques disclosed in the above references yet gives a sufficiently high adhesive strength.

Further, so far as known to the inventors, there has not yet been proposed any effective technique for treating the metal-resin interface to make it acid resistant.

SUMMARY OF THE INVENTION

Objects of this invention are to provide a composite of metal and resin wherein the adhesive strength between the resin and the metal is high and the resin-metal interface (namely metal layer) is highly resistant to acids, and a method for producing the same.

This invention provides a composite of metal and resin comprising a resin layer and a metal layer having a surface roughness of a degree giving a lusterless appearance and a color of olive brown to black closely adhered through the surface to the resin layer.

This invention also provides a composite of metal and resin comprising the first rugged part formed on the surface of a base metal, the second rugged part formed of a reduced metal covering the surface of the first rugged part along the rugged surface (that is to say, along the minute ups and downs of the surface) more thinly and with a more finely rugged surface than the first rugged part, and a resin layer closely adhered to the surface of the second rugged part.

This invention further provides a composite of metal and resin comprising a resin layer and a metal layer obtained by electrolytic reduction closely adhered to the resin layer.

This invention further provides a composite of metal and resin comprising a base metal layer, a reduced metal layer which is provided on the base metal layer and is obtained by electrolytic reduction of an oxidized metal film, and a resin layer closely adhered onto the reduced metal layer.

This invention further provides a process for producing a composite of metal and resin comprising a step of closely adhering a reduced metal layer obtained by electrolytic reduction of an oxidized metal film surface to a resin layer.

This invention further provides a process for producing a composite of metal and resin which is an insulated printed circuit board comprising the first step of subjecting the surface of a thin metallic copper layer of an insulating board having the thin metallic copper layer on the surface to an oxidation treatment to form an oxidized copper film on the surface, the second step of electrolytically reducing the copper oxide film to an extent not harmful to the adhesion of the film to a resist, the third step of covering the electrolytically reduced oxidized copper film with a resist for non-circuit part alone, the fourth step of attaching copper by chemical plating in a thickness necessary for a circuit conductor onto the circuit part of the electrolytically reduced oxidized copper film not covered with the resist, and the fifth step of then removing the resist and thereafter removing by etching the metallic copper layer and the electrolytically reduced oxidized copper film of the non-circuit part.

This invention further provides a process for producing a composite of metal and resin which is a multilayer printed circuit board comprising a step of boring plural holes through respective insulation sheets provided with a metallic copper layer on both sides followed by plating the inner wall of the holes, a step of oxidizing the surface of the metallic copper layer to form an oxidized metal film thereon, a step of then electrolytically reducing the oxidized metal film, a step of then laminating a resist and conducting printing and developing to form a circuit pattern, a step of subjecting the respective sheets provided with the resist in the preceeding step to an etching treatment, a step of oxidizing the side face of the part of the metallic copper layer left behind to serve as a circuit to form an oxidized metal film, a step of peeling the resist off and washing the remaining system, a step of laminating and bonding the sheets obtained through the successive steps mentioned above through the intermediation of pre-pregnated sheet, a step of forming through-holes in the pad part, and a step of plating the inner surface of the said through-holes.

DESCRIPTION OF THE PREFERRED EMBODIMENTS

Figure 1:
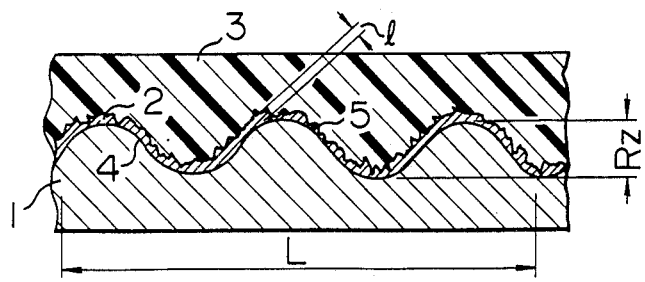
FIG. 1 is a schematic sectional view of a composite of metal and resin according to an embodiment of this invention.

The composite of metal and resin of this invention is characterzed by producing it by forming an oxidized film, followed by subjecting the oxidized film to an electrical reducing treatment. Therefore, the base copper foil and the copper deposited by reduction thereon are different in crystal structures and their shapes. Further, since the resulting surface portion is made similar to the oxidized film having fine rugged surface, it is strong in peeling strength even if the degree of ruggedness is small. Moreover, since the surface portion has been subjected to the reducing treatment, it is stable against an acid; this is quite contrary to the surface obtained by the conventional method for forming an oxidized film on the metal (copper) surface wherein the surface is poor in resistance to hydrochloric acid. In addition, the composite of metal and resin of this invention is also different from the materials obtained by the method of roughing the surface by mechanical means or by forming a copper foil by electric plating in that the degree of ruggedness of the copper surface is very small and the structure of copper layer is a double structure while that of the prior art method is a single structure. That the degree of ruggedness of the copper surface according to the prior art method is large means that the surface is stable for an acid but is very difficult to be subject to etching for forming very fine copper wiring.

[State of Interface Between Metal and Resin; Degree of Luster and Color]

The interface is desirably lusterless in appearance and olive brown to black in color. The degree of luster as determined in terms of direct reflectivity in a wavelength region of 600 to 700 nm is preferably 50% or less, more preferably 20% or less. As determined by using Munsell Book of Color, the hue is preferably in the range of 7.5 RP to 7.5 Y, more preferably in the range of 10 RP to 2.5 Y, the value is preferably 7 or less, more preferably 6 or less, and the chroma is preferably 12 or less, more preferably 8 or less.

Accordingly, even when the metal is copper, for example, the metal surface does not assume so-called metallic luster of copper, namely so-called copper color. However, the black or olive brown color of the metal surface is due not to dirt such as mass or other foreign substances, much less to copper oxide. The color is due to pure metal. Namely, the metal surface has a considerably fine, dense or porous or sponge-like structure, which causes scattering of light, resulting in olive brown to black color in appearance. Since the metal surface of the composite of this invention has a very fine and dense structure of the degree mentioned above, when it is press-bonded to a resin, the resin gets into the microporous portion of the surface, which results in enhanced adhesive strength. Further, since the interface is not an oxidized film but a metal film, it has good acid resistance. Metals having such a surface state cannot be obtained by reduction of an oxidized metal film under a high-temperature gas.

[Direct Reflectivity]

The above-mentioned evaluation in terms of direct reflectivity is conducted by using a Color Analyzer using a halogen lamp as the light source and barium sulfate as the reference white plate. The working principle of the analyzer is well known and the operation conditions are described later, but some of them are briefly described below. A specimen is illuminated by a white diffused light and the reflected light in the vertical direction is measured spectrophotometrically to determine the spectral reflectance (spectral radiance factor) and the spectral transmittance of the colored object. When a lustrous material is used as the reflective specimen, the luster greatly affects the results, resulting in a considerable difference between the photometric value obtained after eliminating regular reflection by using a light trap (diffused reflectivity) and the value obtained by including regular reflection by using a light diffuser (total reflectivity or direct reflectivity). The reflectivity refers to the ratio of the intensity of light reflected by the specimen to that by the reference white plate under the same conditions expressed in terms of percentage (namely, the proportion of the reflected light intensity from the specimen to that form the reference white plate taken as 100). In other words, the direct reflectivity is the photometric value of the reflectivity including also the one due to regular reflection.

[Munsell Book of Color]

The Munsell Book of Color used in this invention is the one specified in JIS. As is well known, the Book of Color (also called color chips) is arranged in accordance with hue (H), value (V) and chroma (C). Usually, a color is indicated in such a form as, for example, 10 RP 7/8, which is read as "ten, R, P, eight of seven". When the book is opened at the page of 10 RP (also called the chart of 10 RP; this refers to a hue), all colors whose hue belongs to 10 RP are found arranged on the page. Then, the intersecting point of a transversal line passing the point 7 on the axis of ordinates and a longitudinal line passing the point 8 on the axis of abscissas is determined to find that color chip having the given color of 10 RP 7/8 at the point. The V or values are indicated at intervals of 1 on the axis of ordinates and the C or chromas at intervals of 2 on the axis of abscissas. When colors having the word "brown" in their common color names are expressed in terms of representative values of color chips, light brown is 5 YR 3.5/4, brownish-crimson is 8.5 R 3/4.5, dark brown is 2 YR 2/1.5, olive brown is 5 YR 3.2/2, brownish gray is 6.5 YR 6/1, and greenish brown is 5 Y 4/3.5. Black does not belong to the group of these brownish hue but is called an achromatic color. Since black has an attribute of value (V) but does not give chroma, the above-mentioned method of expression by means of color chips cannot be applied to black. Black is usually expressed as N 1 or N 1.5. The V-value of black color is usually 2 or less.

[State of Interface Between Metal and Resin: Shape of Rugged Part]

The relation between the first rugged part formed on the surface of a base metal and the second rugged part formed of a reduced metal covering the surface of the first rugged part along the rugged surface (namely, along the minute ups and downs of the surface) more thinly and with a more finely rugged surface than the first rugged part is important from the point of adhesive property, and is illustrated with reference to a schematic view, FIG. 1. In FIG. 1, 1 is a base metal layer, 2 is an electrolytically reduced metal layer, and 3 is a resin layer. The ups and downs of the surface of the base metal layer 1 correspond to the first rugged part 4 and the ups and downs of the surface of the electrolytically reduced metal layer 2 correspond to the second rugged part 5. Thus, the metal is adhered to the resin layer 3 through the second rugged part 5 of the electrolytically reduced metal layer 2. Since the second rugged part 5 has a fine surface structure, the interface gives a high adhesive strength. Although the electrolytically reduced metal layer 2 is formed of metal, it exhibits the above-mentioned color, namely olive brown to black owing to light scattering caused by the microporous structure of the surface as shown in the Figure.

The surface roughness of the first rugged part 4 is preferably 6 $\mu$m or less, more preferably 3 $\mu$m or less in terms of $R_z$ at a standard length L of 100 $\mu$m as defined in JIS B 0601. Although a more rough surface shows good adhesive property, it causes difficulties in pattern formation conducted by etching.

The film thickness (the maximum width) l of the second rugged part 5 is preferably 70 Å or more and smaller than the surface roughness of the first rugged part 4. In general, such a thick film cannot be obtained by reducing a metal surface which has been oxidized naturally by allowing it to stand in the air, but be obtained by purposely forming a thick oxidized metal film and then reducing it electrolytically as in the embodiment of this invention. The surface has preferably the above-mentioned appearance as to color, and further is preferably lusterless.

[Metal]

Typical examples of metals to be used in this invention are copper or alloys and diffusion products comprising copper as their principal component. Besides these, iron, nickel and the like may suitably be used.

From the viewpoint of working process steps, the base metal layer 1 and the electrolytically reduced metal layer 2 are preferably formed of a metal of the same kind. Basically, the two are different from each other in crystal structure and shape since the processes used to form them are different from each other.

Some oxidized metal may remain in the electrolytically reduced metal layer 2. In this case, a good adhesive property inherent to oxidized metal may also be expected. However, the amount of the oxidized metal should be controlled carefully since too much amount thereof causes problems in the resistance to acids. It is needless to say that there is no harm in the existence of remaining oxide.

[Resin]

Typical examples of resins to be used in this invention are those of polyimide type. But, other resins such as epoxy resins may also be suitably used. Though a polyimide type substrate is more excellent in dimensional stability than epoxy type one, it shows a poor adhesion to copper on the other hand. When copper oxide is used for improving the adhesive strength, the resistance to acids is lowered. Since these problems can be solved by using the process of this invention, a combination of copper with polyimide type resins becomes a representative example in this invention. In multi-layer printed circuit board, polyimide is used as a pre-pregnated sheet.

[Uses]

Typical examples of uses of the composite of this invention include so-called printed circuit boards and multi-layer printed circuit boards. However, the process of this invention is, besides being applied to preparation of printed circuit boards, useful as a method of adhesion giving a metal to resin bond which exhibits high adhesive strength and is resistant to acids, for example as a method of surface-treatment of a metal to be used as the base for coating. Thus, when a coated film has pinholes, acid solution may penetrate through the pinholes. Accordingly, when an oxidized metal film is used to enhance the adhesive strength between a metal and the coated film, the oxidized metal film is dissolved out and the coated film is liable to be peeled off. Such acid solutions are easily formed when water simply comes in contact with air, whereby carbon dioxide present in the air is dissolved into water, forming carbonate ions thereby. As mentioned above, however, the electrolytically reduced film is resistant to acids and, further, effective for enhancing the adhesion between metal and resin. Accordingly, the method of this invention is sufficiently useful as a method for surface-treatment of a metal to be used as a base for coating.

[Method of adhesion]

The electrolytically reduced metal layer and the resin are preferably tightly adhered to each other under conditions of a temperature of 100° C. or higher and a pressure of 5 kg/cm$^2$ or more.

[Electrolytic reduction]

Figure 2:
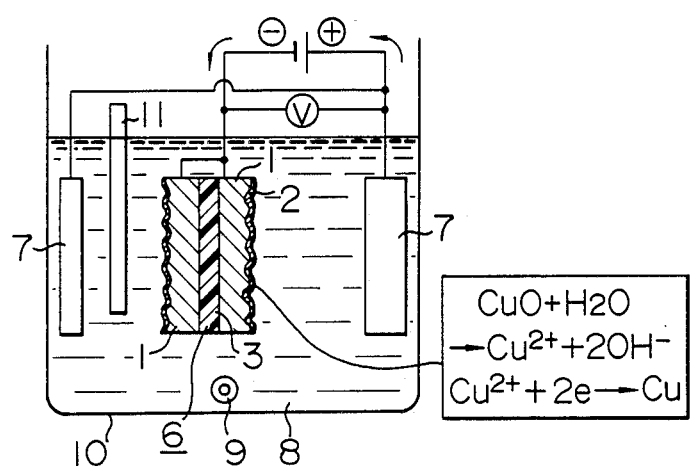
FIG. 2 is a drawing illustrating the principle of an electrolytic reduction apparatus.

A method for conducting electrolytic reduction is described with reference to FIG. 2. In the Figure, 6 is a specimen to be reduced electrolytically, and 7 is an opposite electrode. Though a stainless steel plate is used as the opposite electrode 7 in this embodiment of the invention, other materials such as platinum, copper, carbon, lead, and silver may also be suitably used since any material will suffice so long as it is an insoluble electric conductor. Numeral 8 indicates an electrolytic solution, which has preferably a pH of 6 or more. Arrows in the Figure indicate the direction of flow of electrons (e). The reaction occurring at the surface of the specimen 6 can be expressed by equations:

$$CuO + H_2O \rightarrow Cu^{2+} + 2OH^- \quad (1)$$

and $$Cu^{2+} + 2e \rightarrow Cu \quad (2)$$

If it is assumed that $Cu^{2+}$ ions are present in a relatively large number in the surrounding of the specimen owing to dissolution of CuO, the reaction rate in equation (2) will be determined by the number of electron replenished from an outside electric source.

[Oxidation of Metal Surface]

The reactions are described below in succession starting with the oxidation step. It is assumed that Cu is oxidized by $NaClO_2$ to form $Cu^{2+}$, which then reacts with $OH^-$ in an alkaline solution to form $Cu(OH)_2$, while a part of $Cu^{2+}$ ions react with $PO_4^{3-}$ to form precipitates such as $Cu_3(PO_4)_2$. Thus, assumable reactions are expressed as follows:

$$Cu \xrightarrow{NaClO_2} Cu^{2+} + 2e \quad (3)$$

$$Cu^{2+} \xrightarrow{NaOH} Cu(OH)_2 \quad (4)$$

$$2Cu(OH)_2 \xrightarrow{Na_3PO_4 \cdot 12H_2O} Cu_3(PO_4)_2 \downarrow \quad (5)$$

$$NaClO_2 \longrightarrow Na^+ + ClO_2^- \quad (6)$$

$$ClO_2^- \longrightarrow Cl^- + 2(O) \quad (7)$$

$$H_2O + 2(O) \longrightarrow H_2O_2 \quad (8)$$

$$H_2O_2 + 2e \longrightarrow 2OH^- \quad (9)$$

Accordingly, since the reaction as a whole will proceed as the sum of equations (3) and (9), it can be assumed that the whole reaction is expressed by equation (10):

$$Cu + H_2O_2 \rightarrow Cu^{2+} + 2OH^- \rightarrow Cu(OH)_2 \downarrow \quad (10)$$

As can be seen from the foregoing, the metal oxide $(Cu(OH)_2 \downarrow \rightarrow CuO + H_2O)$ precipitates into the copper surface (surface of the specimen 6). Since $Cu(OH)_2$ formed is a fine pulverous solid in appearance and has very small perticle diameters (several hundreds Å), it can be estimated that the second rugged part 5 would be formed with a considerably fine ruggedness.

[Relation Between Deposition Rate of Metal and Adhesive Strength]

When the oxidized metal film thus formed is subjected to electrolytic reduction, it is converted to metallic copper and is deposited as such. When the deposition of the film is slow, the density of crystal nuclei being formed is low and the metal will deposit selectively at defects (such as kinds and steps) where the deposition can easily occur; resultantly, the crystals can lose their original fine rugged form and grow into large crystal grains, resulting in lowering of the adhesive strength to the resin. When the deposition rate is increased, on the other hand, the deposition occurs in the form of pure metal while the original finely rugged form is being maintained, which results in increase of the adhesive strength to the resin and the resistance to hydrochloric acid.

[Relation of Liquid Temperature and Stirring with Deposition of Metal]

Figure 3A:
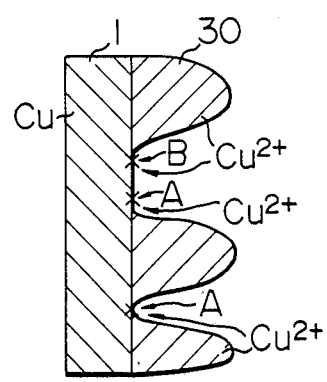
FIG. 3A-B is a drawing illustrating the deposition of a metal caused by electrolytic reduction.
Figure 3B:
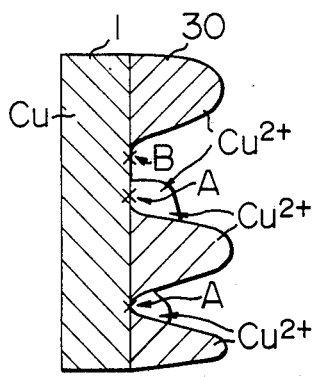

At a constant current density, when the liquid temperature is low, the metal ions (e.g. $Cu^{2+}$) diffuse with difficulty, which results in diminution of crystal grain diameters. When the liquid temperature is high, on the other hand, the metal ions ($Cu^{2+}$) diffuse easily, the crystal grain diameters being increased thereby. This phenomenon is illustrated in FIGS. 3(A) and 3(B). FIG. 3(A) shows a case where liquid temperature is low and FIG. 3(B) shows a case where it is high. Further, A in FIGS. 3(A) and 3(B) indicates a spot where deposition takes place easily, whereas B indicates a spot where deposition takes place with difficulty. Also, the degree of stirring of the liquid has an effect on the mobility of $Cu^{2+}$, resulting in variation of grain sizes of the crystal.

[Current Density]

Immediately after the start of the electrolytic reduction, the reduced metal begins to deposit first at numerous defects present on the base metal surface. When the current density is low, large metal crystals will grow with the above-mentioned original defects serving as centers. This phenomenon is similar to that shown in FIG. 3(B). When the current density is high, on the other hand, fine metal crystal grains will deposit also on other parts than the defects, namely on the flat part (also called "terrace") of the base metal. Since the deposited crystal grains correspond to new defects, crystals will grow in minute size but in many spots. This phenomenon is similar to that shown in FIG. 3(A). Thus, electrolytic reduction at a high current density is particularly preferable for this invention since it gives a finely rugged metal surface more easily.

[Difference from Hydrogen Reduction]

Since a high temperature (650° C. to 800° C.) is required in hydrogen reduction unlike electrolytic reduction, even when a rugged surface is originally present, the irregularities are leveled down owing to the high temperature and the surface becomes more flat. Consequently, this method gives a surface with metallic luster. Being a metal interface, an interface produced by this method is considerably resistant to acids and less liable to cause peeling due to dissolution of oxidized metal film by acids, but it still leaves the problem of insufficient adhesive strength unsolved.

In electrolytic reduction, each of the metal oxide grains is reduced on the spot. At high temperatures the crystal growth proceeds. Even at low temperatures, most of the metal diffuses and then deposits. Though the shapes of the grains are apparently maintained, there are changes when viewed closely. The metal deposits on the center nuclei and grows as crystals. Consequently, metal films with considerably fine surface structure can be obtained.

In hydrogen reduction, on the other hand, though a porous body is produced in principle after oxygen has been eliminated by heat treatment, it is necessary to maintain the porous state. However, it is presumed that at temperatures of 500° C. or higher, local crystal growths would proceed and the above-mentioned levelling of irregularity would occur, whereby the porous state would disappear locally and flattening of the surface would proceed. [Method of Forming Metal Substrate]

One method will be described by way of an example. A metal is deposited electrolytically onto a stainless steel plate. A pre-preg sheet is placed between the deposited metal surfaces of two such plates prepared above and the whole is hot-pressed. The deposited metal layer is adhered to the pre-preg sheet and can be easily peeled off from the stainless steel plate. It is needless to say that the deposited metal layer on the stainless steel plate may also be used as a base metal to be subjected to oxidation and electrolytic reduction successively and then adhered to a pre-preg sheet.

[Others and Summary]

In order to obtain a metal to resin adhesion with a high adhesive strength, there has hitherto been commonly used a method which comprises roughening the surface of the metal, oxidizing the roughened metal surface to form an oxidized metal film on the surface, and then adhering the metal to the resin through the intermediation of the oxidized metal surface. However, although a metal-resin composite prepared by the above method has an extremely high adhesive strength, it has a disadvantage in that since an oxidized film is used in the adhesion interface of the composite, the interface is easily dissolved with acids and is chemically unstable.

Accordingly, the present inventors have studied to find a method for surface treatment giving a treated film which is stable to acids and enables a strong adhesion to resins. The mechanism of adhesion through the oxidized metal film which can account for increased adhesive strength between metal and resin was investigated. As a result, it has been found that the surface of the oxidized film is roughened into a complciated shape, which is the main factor in forming a strong adhesion between resin and metal. Further, it can be assumed that oxidized films facilitate the formation of hydrogen bonds to the resin as compared with metal, and the hydrogen bonds serve as another factor in adhering the metal to the resin strongly through the oxidized film.

Thus, the present inventors have attained a method which comprises, in order to obtain a treated film similar to an oxidized metal film in shape and facilitating the formation of hydrogen bonds, reducing an oxidized metal film electrolytically, thereby forming a reduced metal film containing an inevitable amount of oxide on the metal surface, and then adhering the metal to the resin through the intermediation of the film. When the method is used, the amount of oxide in the reduced metal film is far smaller than that of the oxide constituting the prior oxidized metal film. Consequently, improved acid resistance can be expected.

As is apparent from the foregoing, when the process of this invention is used in producing a printed circuit board, it is desirable that a bare reduced metal is exposed at least at parts abutting on through-holes. As to adhesive properties, both hydrogen bonds and an anchor effect caused by surface roughening can be expected.

Test methods used in this invention and the results obtained by these methods are as described in the following.

[Method of Electrolytic Reduction]

The substrate used in electrolytic reduction was prepared as follows: a copper plating of 35 μm in thickness was applied by using a chemical plating liquid on the copper foil of an epoxy-glass cloth board plated with copper on both sides (copper foil thickness: 35 μm, epoxy-glass cloth layer thickness: 0.2 mm); then the board was subjected to heat treatment in the air at 180° C. for 1 hour and further to chemical oxidized-film forming treatment. The conditions of the oxidized-film forming treatment were as described before. The substrate was placed in an electrolytic cell 10 shown in FIG. 2 and the oxidized film on the copper foil was reduced electrolytically by using a constant current method. The conditions of electrolytic reduction were varied as to liquid temperature, stirring and current density. The electrolytic cell 10 was provided with a temperature controller 11 and a piping 9 through which Ar gas can be blown into the electrolytic solution for stirring the solution. The reduction potential vs. reduction time was determined, and the end point of the reduction was judged from the potential at which the reduction wave rose sharply.

[Method of Evaluation of Adhesive Characteristics and Resistance to Hydrochloric Acid]

The adhesive characteristic was evaluated by determination of peeling strength. The specimen used was prepared by laminating and bonding the substrates, which has been subjected to the electrolytic reduction treatment, with pre-preg sheets. Four pre-preg sheets each 0.05 mm in thickness were used in a pile. The bonding was conducted at 170° C. for 90 minutes under a pressure of 14 kg/cm².

The resistance to hydrochloric acid was evaluated as follows. A specimen of about 10 mm² in size was cut out by means of a low speed cutter, and the section was polished first with emery paper (#1000) and then by buffing using (#2000) Al₂O₃ polishing material. The specimen was dipped in an aqueous hydrochloric acid (17.5%) at room temperature for a predetermined time. The resistance to hydrochloric acid was evaluated by measuring the length of discolored part caused by soaking of the acid from the section.

[Observation of Surface Shape and Analysis of Crystal Structure]

The surface shape of chemical copper plating film, oxidation-treated film and electrolytically reduced film was examined by means of a scanning electron microscope (SEM) and the crystal structures by means of reflection electron diffraction. Further, since the ruggedness of the reduced copper surface was very fine and scattering of light was expected to occur, determination of the surface reflectivity was conducted.

[Determination of Surface Reflectivity]

Figure 4:
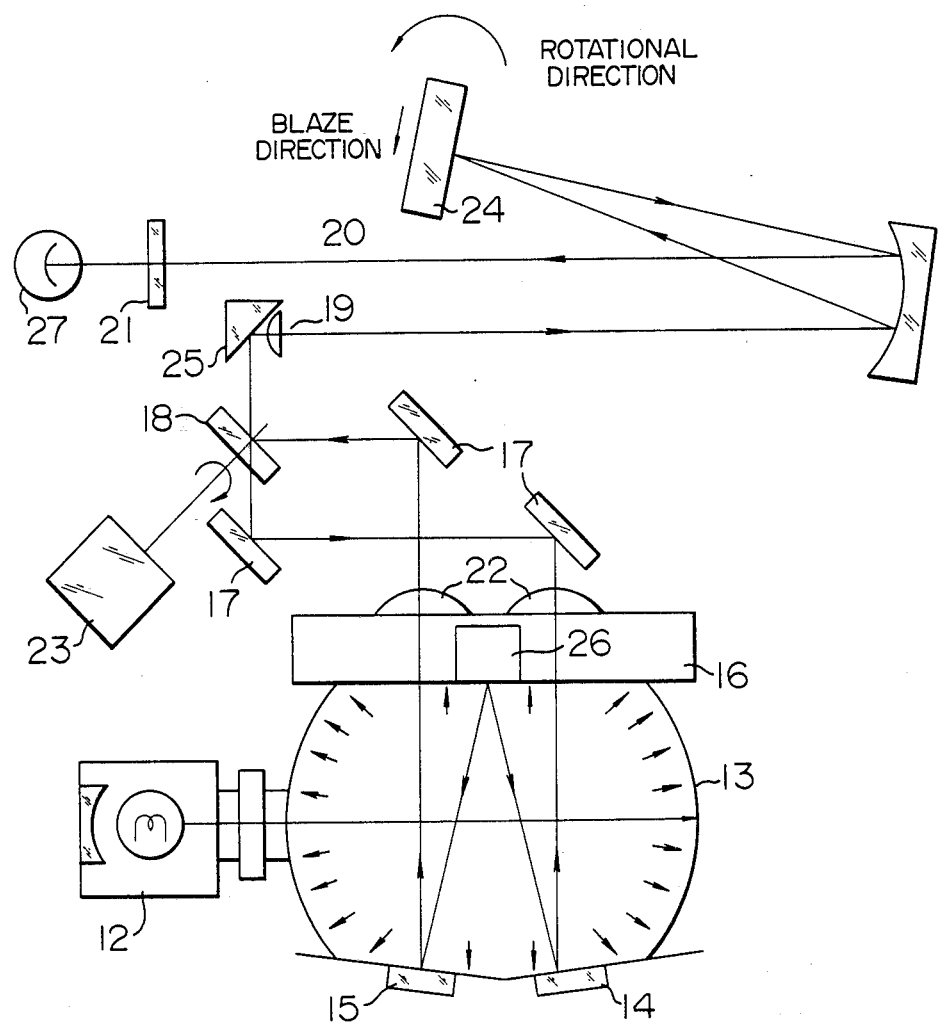
FIG. 4 is an optical flow sheet of a Color Analyzer.

The surface reflectivity was determined by using an analyzer working on the principle described before. The measuring apparatus was a Color Analyzer Type-607 (mfd. by Hitachi, Ltd.). The optical flow sheet of the apparatus is as shown in FIG. 4.

The light source 12 is a halogen lamp (120 W). White light emitted from the lamp is diffuse-reflected in an integrating sphere 13 having an inner diameter of 200 mm and illuminates the specimen 14 and a reference white plate 15. Reflected light from the specimen 14 and that from the white plate 15 pass through a transmission sample chamber 16, enter into a sector chamber provided with a mirror 17 and, selected by a rotary mirror 18, alternately illuminate an entrance slit 19 of a spectroscope. The light which has entered into the spectroscope forms the image of the specimen on a diffraction grating and then is dispersed to illuminate an exhit slit 20. Monochromatic light of wave-width of 5 mm alone enters into a photomultiplier tube via the exit slit 20 and a filter 21. Numeral 22 indicates an entrance lens, 23 a sector motor, 24 a grating, 25 a triangular mirror, 26 a light diffuser and 27 a photomultiplier tube.

[Adhesion Characteristic of Electrolytically Reduced Metal Film]

As to the reaction through which copper ions in the oxidized metal film are reduced and deposited, a route is conceivable wherein copper ions are hydrated, then dissociated into the solution, and thereafter reduced and deposited. In order to improve the adhesion characteristic of the reduced metal film, it is necessary to maintain the surface shape of the oxidized metal surface as it is also after the reduction. For this purpose, the dissociated copper ions are required to deposit immediately on the spot without diffusing in the solution or along the surface of the reduced metal film. In order to render the diffusion of copper ions the rate-determining step, it is preferable to adopt reduction conditions of a high current density, a low bath temperature, and without solution-stirring. On the contrary, when reduction is conducted under conditions of a low current density, a high bath temperature and with solution-stirring, the replenishment of depositing ions to the crystal nucleus proceeds easily; consequently, the crystals grow to a large size, the surface shape become different from the original shape of oxidized metal film, and the reduced metal film tends to assume more flatness.

Figure 5:
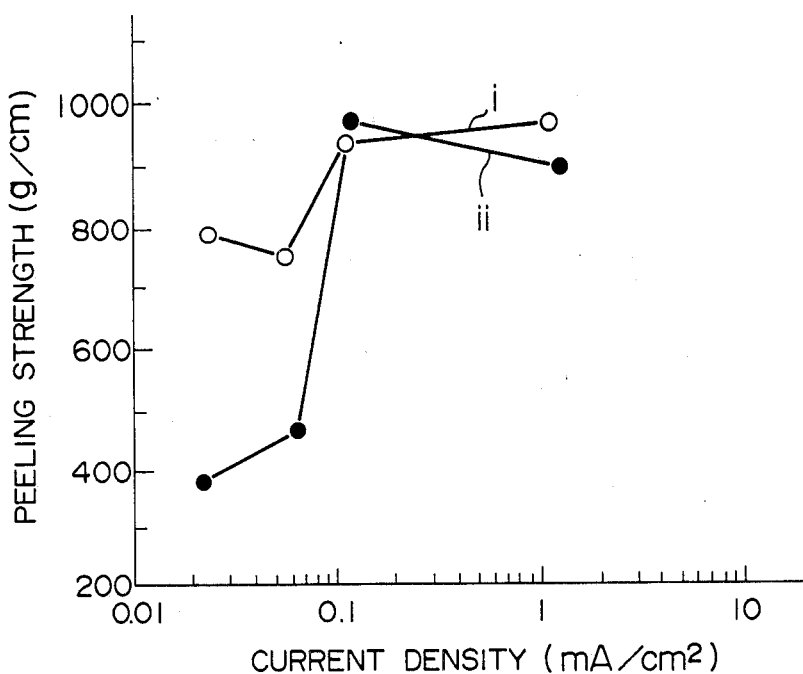
FIG. 5 is a graph showing the adhesive characteristic of an electrolytically reduced film.

Then, in order to examine the selection between the surface shape of the electrolytically reduced film and the adhesive strength, tests were conducted under two selected conditions of 25° C. without stirring and 50° C. with stirring. The results obtained are shown in FIG. 5. The adhesive strength of the reduced metal film immediately after the electrolytic reduction is indicated by curves i and ii. At decreased current density with no stirring (curve i) the peeling strength is increased, whereas with stirring (curve ii) at elevated liquid temperature and decreased current density, the peeling strength is decreased.

[Resistance of Electrolytically Reduced Film to Hydrochloric Acid]

Figure 6:
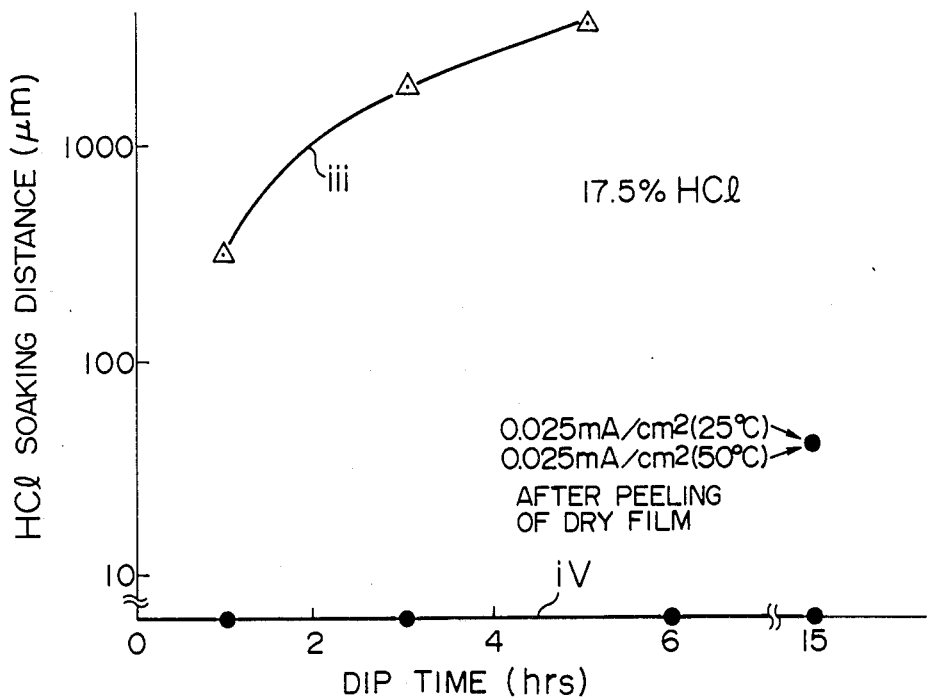
FIG. 6 is a graph showing the resistance characteristics to hydrochloric acid of an electrolytically reduced film and of a film obtained by prior chemical oxidation treatment.

The relation between the hydrochloric acid-soaking distance and the dip time was determined to examine the resistance of the electrolytically reduced film to hydrochloric acid (17.5% HCl). The results obtained are shown in FIG. 6. The conditions of electrolytic reduction were:
25° C., without stirring, 0.025, 0.0625, 0.125, 1.25 mA/cm$^2$;
50° C., with stirring, 0.025, 0.0625, 0.125, 1.25 mA/cm$^2$.
Depending upon conditions of electrolytic reduction, there were sometimes cases where even when the hydrochloric acid is soaked into the sheet, the soaked part showed little discoloration, which made it difficult to determine the soaking distance. For this reason, such sheets were observed carefully with a microscope. For comparison, there are also shown in FIG. 6 the results obtained by examining the hydrochloric acid resistance for specimens which had been subjected only to oxidation treatment and not to electrolytic reduction. In the case of specimens subjected to oxidation treatment alone (curve iii), hydrochloric acid soaking distance of about 200 μm was observed after only 1 hour, and thereafter the distance increased monotonously with increasing dip time. In the case of electrolytically reduced specimens (curve iv), on the other hand, soaking of hydrochloric acid did not occur even after lapse of 6 hours for films prepared under either set of conditions. Further, there were also shown in FIG. 6 the results obtained after 15 hours of dipping. The results showed that although some soaking of hydrochloric acid occurred in system wherein the electrolytic reduction were insufficient (0.025 mA/cm$^2$), no soaking of the acid occurred in the other electrolytically reduced specimens. In any case, it is apparent that electrolytically reduced films give a greatly improved resistance to hydrochloric acid as compared with simple oxidized metal film.

Among the specimens for which reduction and deposition has been conducted at a liquid temperature of 25° C. without stirring, the reduced metal film reduced at a current density of 1.25 mA/cm$^2$ appeared dark brown (olive brown). When the reduction was conducted at 0.125 mA/cm$^2$, the resultant film was light brown in appearance and resembled a specimen subjected only to oxidation treatment in appearance. When the reduction was conducted at 0.0625 mA/cm$^2$, the appearance of the film approached that of a treated film obtained by pre-oxidation treatment. When reduced at a current density of 0.025 mA/cm$^2$, the appearance assumed olive brown (dark brown). This is because the reduction was discontinued since it has not reached the end point even after more than 10 hours of current application.

Each reduced metal film was examined by a scanning electron microscope. The specimen reduced at a current density of 1.25 mA/cm$^2$ resembled in surface shape a specimen before electrolytic reduction subjected only to oxidation treatment. It showed a growth of fine grains to a slightly larger size than that in the specimen reduced at 0.125 mA/cm$^2$. The surface of the specimen reduced at 0.0625 mA/cm$^2$ approached that of a film obtained by pre-oxidation treatment. Further, when reduced at 0.025 mA/cm$^2$, the surface shape of the specimen obtained was more close to those of specimens reduced under conditions of from 0.125 mA/cm$^2$ to 1.25 mA/cm$^2$ than that of the specimen reduced at 0.0625 mA/cm$^2$. This is because electrolytic reduction was discontinued in the case of the above specimen prepared at 0.025 mA/cm$^2$.

Among the specimens for which reduction and deposition had been conducted at a liquid temperature of 50° C. with stirring the one reduced at a current density of 1.25 mA/cm$^2$ assumed an appearance of olive brown and brown distributed in patches. When the reduction was conducted at 0.125 mA/cm$^2$, the specimen was light brown in appearance. When reduced at 0.0625 mA/cm$^2$, the specimen assumed reddish brown, which was close to the color of a film obtained by pre-oxidation treatment. Further, when the reduction was conducted at 0.025 mA/cm$^2$ though the color of the resultant specimen was expected to be closer to copper color, it was yellowish red because the electrolytic reduction was insufficient like in the specimen reduced at 0.025 mA/cm² without stirring.

These specimens were then examined for their surface shape by using a scanning electron microscope. The specimen reduced at a current density of 1.25 mA/cm² resembled a specimen subjected only to oxidation treatment in surface shape. In the specimen reduced at 0.125 mA/cm², fine crystal grains of reduced copper 0.1 μm or less in size were observed, but the number of the grains was smaller and the surface was more flat than in the specimen reduced at 1.25 mA/cm². In the specimen reduced at 0.0625 mA/cm², the crystal grains of reduced copper grew to a large size, large crystal grains about 1 μm in size being observed among those of 0.1 to 0.5 μm size. The specimen reduced at 0.025 mA/cm² had approximately the same surface shape as that of the specimen obtained by reduction at 0.0625 mA/cm². Further, those specimens which had a surface covered with fine crystals showed a high peeling strength, revealing a strong dependency of adhesive characteristic on the surface shape of the reduced film.

Then, reflection electron diffraction patterns were examined for reduced films prepared at respective current densities under conditions of liquid temperature of 25° C. and without stirring, films prepared at a liquid temperature of 50° C. with stirring, and films prepared by chemical oxidation treatment. In order to analyze the diffraction patterns, first the diameters of respective diffraction lines of Cu, Cu₂O, and Cu₃(PO₄)₂ were determined based on ASTM cards and a standard specimen of Au. As a result, in any of the specimens of oxidation-treated films and reduced films, Cu₂O was observed through in a small amount. Although the reduction was originally intended to obtain a reduced film consisting completely of metallic copper, actually there remained an inevitable amount of oxide.

It is needless to say that the conditions of electrolytic reduction described above represent only some embodiments of this invention and the invention is not limited thereto.

[Results of Determination of Direct Reflectivity]

Figure 7:
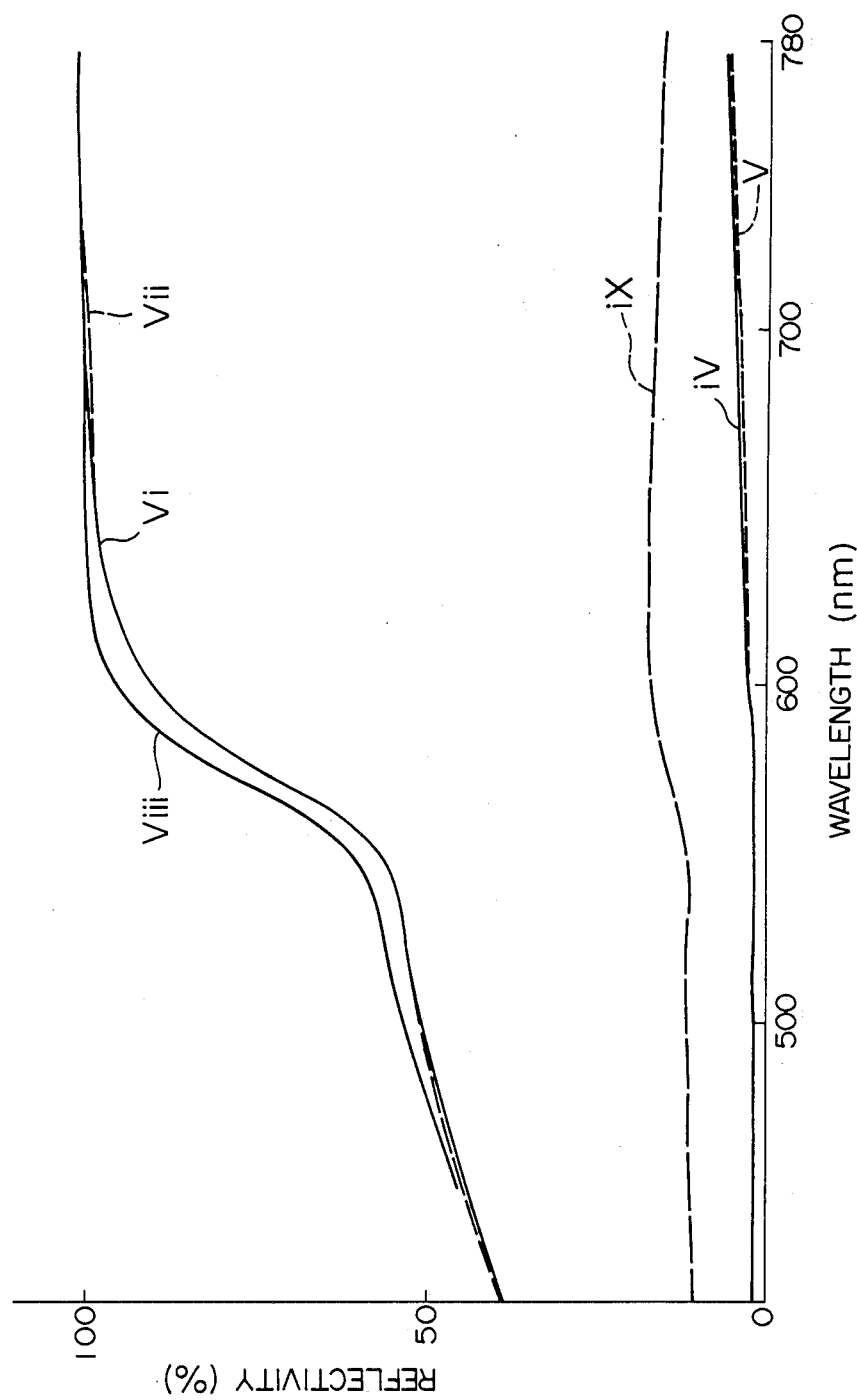
FIG. 7 is a graph showing surface reflection characteristics.

The surface reflectivity was determined on a specimen prepared by conducting the electrolytic reduction in the above-mentioned manner under conditions of 1.25 mA/cm², liquid temperature of 25° C. and without stirring used as the sample of this invention. The specimen was olive brown and lusterless in appearance. A base metal piece of copper (containing some naturally oxidized parts; copper color) was used as the sample of Comparative Example 1 and a copper piece obtained by high-temperature hydrogen reduction (copper color, with luster) was used as the sample of Comparative Example 2. The results of determination was shown in FIG. 7. In FIG. 7, curve iv indicates the direct reflectivity of the sample of this invention and curve v indicates the diffuse reflectivity of the same sample. Curve vi indicates the direct reflectivity of the sample of Comparative Example 1, and curve vii the diffuse reflectivity of the same sample. Further, curve viii indicates the direct reflectivity of the sample of Comparative Example 2, and curve ix the diffuse reflectivity of the same sample. The diffuse reflectivity was determined in the same manner as that for direct reflectivity but by replacing the light diffuser 22 in FIG. 4 with a trap.

As is apparent from FIG. 7, the specimen of this invention does not give a high direct reflectivity which is normally expected for surfaces of so-called metallic copper.

This invention will be illustrated below with reference to Examples.

EXAMPLE 1

An embodiment of this invention is illustrated below with reference to FIGS. 8(A) to 8(G).

Figure 8A:
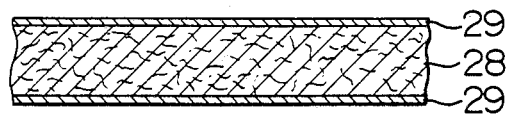
FIG. 8A-G is a chart showing the steps of forming a printed circuit board.
Figure 8B:
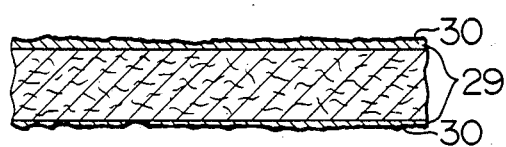

The surface of a glass fiber-reinforced epoxy resin board 28 having copper foil 29 hot-pressed onto its both sides (FIG. 8(A)) was treated with an phosphoric-acid type aqueous solution having the composition:

| | |
|---|---|
| NaOH | 5 g/l |
| Na₃PO₄.2H₂O | 10 g/l |
| NaClO₂ | 30 g/l | to form an oxidized copper film 30 on the surface of the copper foil 29 (FIG. 8(B)). After washed with water, then, the oxidized copper film 30 was subjected to electrolytic reduction to an extent not harmful to the adhesion to a resist mentioned later to obtain an electrolytically reduced metal layer 2 (FIG. 8(C)).

The electrolytic reduction was conducted by using a solution adjusted to pH 12.0 with NaOH as the solution for electrolytic reduction, at a liquid temperature of 25° C. and a reduction current density of 1.25 mA/cm², and by using a stainless steel plate as the opposite electrode to reduce the oxidized film formed on the surface of copper mentioned above.

Figure 8C:
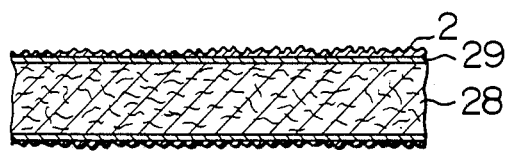
Figure 8D:
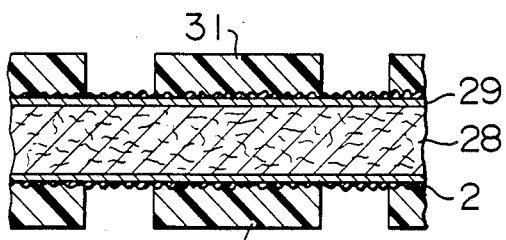

Then, the reduction-treated film was freed from attaching electrolytic solution by water-washing, dried thoroughly, and a resist pattern was formed thereon by using a dry film 31 (FIG. 8(D)).

Then, copper 32 was plated onto the circuit part to a thickness necessary for a circuit conductor by chemical plating using a plating liquid prepared by dissolving the following ingredients in water in the following proportions:

| | |
|---|---|
| CuSO₄.5H₂O | 7 g |
| Ethylenediaminetetraacetic acid | 30 g |
| 37% HCHO | 3 ml |
| NaOH added to adjust pH to 12.5 | |
| Polyethylene glycol | 20 ml |
| (average molecular weight: 450) | |
| 2,2'-Dipyridyl | 30 mg |
| (Water | 1 l) |

Figure 8E:
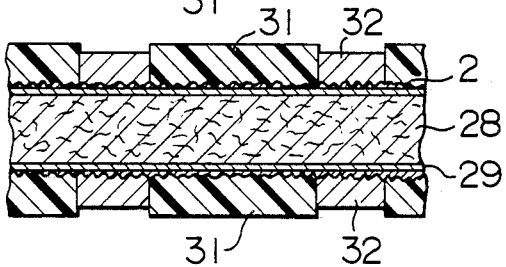

(FIG. 8(E)). As a result, there occurred no deposition of copper onto the non-circuit part due to soaking of the chemical-plating liquid.

Figure 8F:
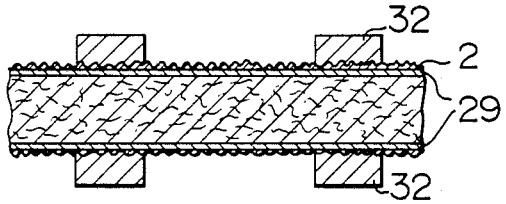
Figure 8G:
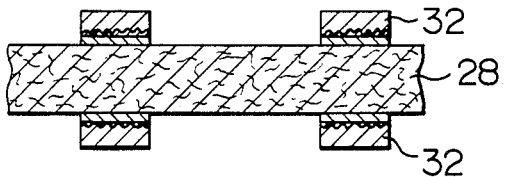

Then, the resist pattern of the dry film 31 was removed (FIG. 8(F)), and thereafter the copper foil on the non-circuit part was removed by etching using an etching solution having the following composition:

| | |
|---|---|
| FeCl₃ | 400 g/l |
| Conc. HCl | 20 ml/l, | whereby copper 32 was left behind on the glass fiber-reinforced epoxy resin substrate 28 to complete the copper wiring (FIG. 8(G)).

The pattern of the copper wiring thus obtained showed a ratio of copper conductor width (μm)/space between conductors (μm) of 49/51, which was close to the corresponding ratio of 50/50 of the resist pattern used, showing that it has a desired good pattern accuracy.

EXAMPLE 2

The process of Example 1 was repeated expect for using a polyimide board in place of the glass fiber-reinforced epoxy resin board 28 used in Example 1. As a result, it was found that the pattern of the copper wiring thus obtained had an above-mentioned ratio of 49/51, which was close to the corresponding ratio of 50/50 of the resist pattern used, and thus it had a desired good pattern accuracy.

EXAMPLE 3

The process of Example 1 was repeated except for using a liquid resist in place of the dry film resist used in Example 1 and altering the pH of electrolytic solution to 6.0. As a result, it was found that the pattern of the copper wiring thus obtained had an above-mentioned ratio of 48/52, which was close to the corresponding ratio of 50/50 of the resist pattern used, and thus it had a desired good pattern accuracy.

EXAMPLE 4

The process of Example 1 was repeated except for using an aqueous solution having the composition:

| KMnO$_4$ | 10 g/l |
|---|---|
| NaOH | 10 g/l | for treating the copper foil surface in place of the phosphoric acid type aqueous solution used in Example 1. As a result, it was found that the pattern of the copper wiring thus obtained had an above-mentioned ratio of 49/51, which was close to the corresponding ratio of 50/50 of the resist pattern used, and thus it had a desired good pattern accuracy.

The reaction occurring in electrolytic reduction of the oxidized copper film is estimated as follows. Namely, the following mechanism can be postulated as the principal reaction:

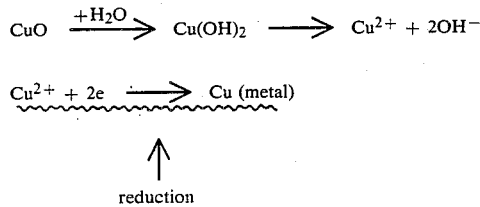

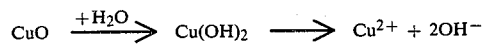

reduction

The pH of the electrolytic reduction liquid is preferably 6 or higher. Because, at a pH of about 5.5 or lower, the following reactions:

$$CuO \xrightarrow{+H_2O} Cu(OH)_2 \longrightarrow Cu^{2+} + 2OH^-$$

proceed rapidly and an electrolytically reduced film of desired shape can be hardly obtained when a substrate prepared by forming an oxidized copper film on copper foil is dipped in the electrolytic solution.

The copper wiring board obtained in each of the above Examples was found to contain phosphorus, manganese, or chlorine or oxygen in the film subjected to the electrolytic reduction depending on the kind of above-mentioned solution for oxidation treatment used in forming the film.

In each of the above Examples, there was described a case where the circuit was formed on the both sides of the insulating substrate 28. However, it is needless to say that this invention can also be applied to cases where the circuit is formed on one side alone. Also, though the substrate 28 having copper foil 29 hot-pressed thereon was used by way of illustration, there can also be used in place of such a substrate an insulating substrate having a thin copper layer applied on the surface by means of chemical plating.

COMPARATIVE EXAMPLE 3

A copper wiring was formed on a glass fiber-reinforced epoxy resin board under the same conditions and in the same manner as in Example 1 except that the step of electrolytic reduction (FIG. 8(C)) in Example 1 was omitted. It was found that a part of copper ions in the oxidized film formed on the copper foil was reduced and subsequently copper ions in the plating solution came to be reduced and deposited onto the non-circuit part. As a result, the pattern of the copper wiring showed an above-mentioned ratio of 43/57, which was quite different from the corresponding ratio of 50/50 of the resist pattern used, and thus had a poor pattern accuracy.

EXAMPLE 5

An embodiment of this invention is illustrated below with reference to FIGS. 9(A) to 9(F).

Figure 9A:
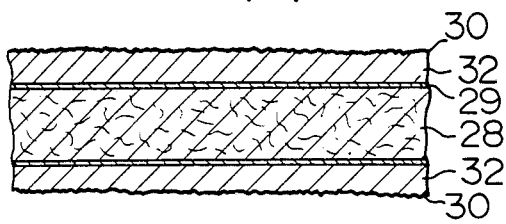
FIG. 9A-H is a chart showing the steps of forming a multi-layer board.
Figure 9B:
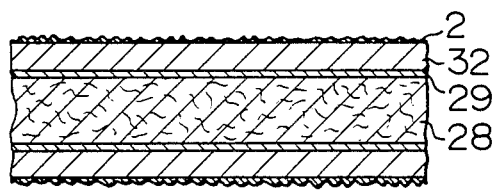

On a copper foil 29 hot-pressed on both sides of a glass fiber-reinforced epoxy resin board 28, was plated with copper 32 by chemical plating to a thickness required for a circuit conductor. Then, the surface of copper 32 was treated with a phosphoric acid type aqueous solution having the composition:

| NaOH | 5 g/l |
|---|---|
| Na$_3$PO$_4$.2H$_2$O | 10 g/l |
| NaClO$_2$ | 30 g/l | to form an oxidized copper film 30 on the surface of copper 32 (FIG. 9(A)). After being washed with water, the oxidized copper film 30 was subjected to electrolytic reduction to an extent not harmful to the adhesion to the pre-preg sheet described later (FIG. 9(B)). The electrolytic reduction was conducted by using an aqueous NaOH solution (5 g/l, pH 12) at a current density of 2 mA/cm$^2$ and using a stainless steel plate as the opposite electrode.

Figure 9C:
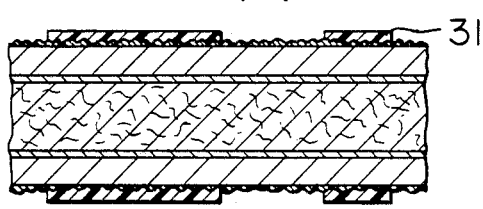

Then, a resist pattern was formed on the above-mentioned electrolytically reduced metal layer 2 by means of a dry film 31 (FIG. 9(C)).

The copper (29 and 32) of the non-circuit part was then removed by etching using a ferric chloride type aqueous solution having the composition:

| FeCl$_3$ | 400 g/l |
|---|---|
| Conc. HCl | 20 ml/l |

Figure 9D:
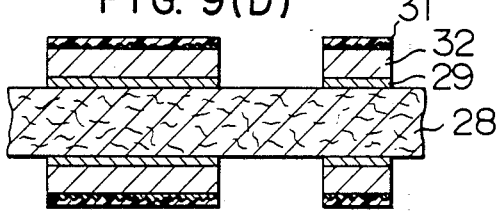
Figure 9E:
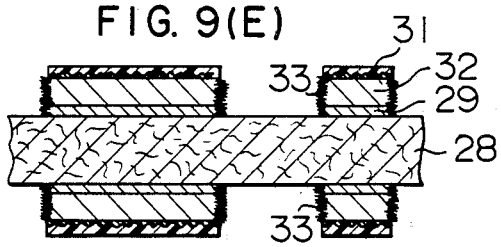
Figure 9F:
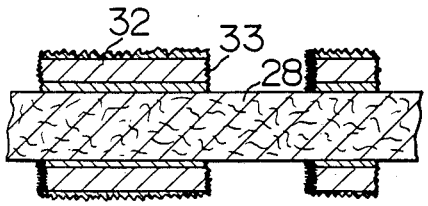

(FIG. 9(D)). Then, the system was treated again with the same phosphoric acid type aqueous solution as mentioned above, while the dry film 31 was being held on the spot, to form an oxidized copper film 33 on the side face of the copper wiring (FIG. 9(E)). Thereafter, the dry film 31 was removed by using, for example, methylene chloride (FIG. 9(F)).

Figure 9G:
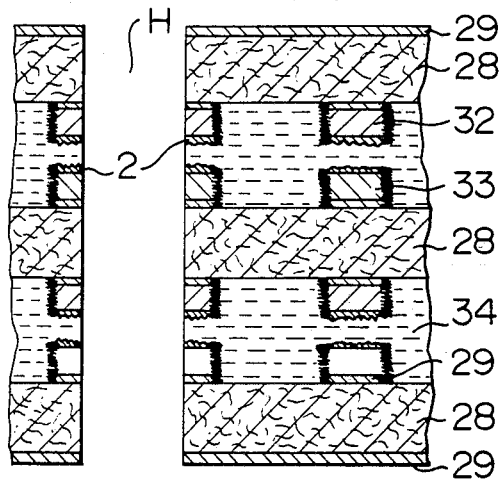

The single boards having copper wiring applied thereon as mentioned above were piled up with a pre-preg sheet 34 of glass fiber-reinforced epoxy resin type being interposed between them and the whole was heated and press-bonded by using a hot press. (As the outermost-layer single board in the above system, however, there was used the one having no copper wiring applied on the outermost surface, namely having the original copper foil 29 thereon). Then, a through-hole H penetrating through a predetermined circuit conductor part was bored (FIG. 9(G)). In this state, the oxidized copper film 33 formed on the side face of the copper wiring 32 is not exposed to the inner surface of the through-hole but is in a separated position therefrom. Thereafter, a catalyst for chemical plating was applied to the inner surface of the through-hole, and then the inner surface of the through-hole and the whole surface of the outermost layer were coated with copper 32 by chemical plating to a thickness required for a circuit conductor. Then, a resist pattern was formed on the outermost layer by means of a dry film, the copper of the non-circuit part was removed by etching, and then the dry film was removed. Thus, a multi-layer wiring board was completed (FIG. 9(H)).

Figure 9H:
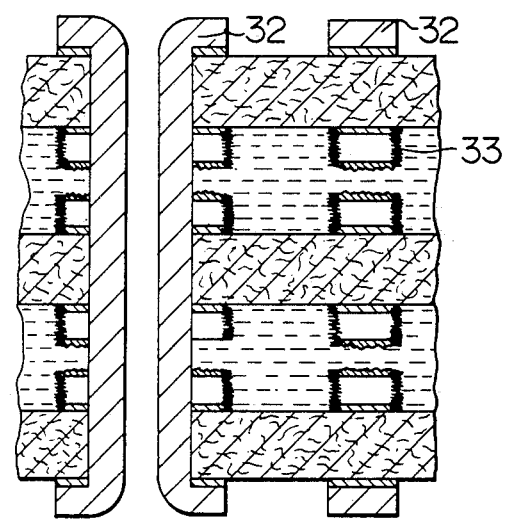

In the structure of the multi-layer wiring board thus completed, as shown in FIG. 9(H), the plane part of the copper conductor is not covered with oxide of copper and only the side part thereof is covered with oxide of copper.

In the above-mentioned process for preparing a multi-layer wiring board, there is no chance for the oxidized copper layer to come into direct contact with the acid solution in the through-hole during the pre-treatment step of chemical plating applied to the through-hole and the outermost layer. Consequently, the multi-layer wiring board prepared by the above-mentioned process has a good resistance to hydrochloric acid, showed a high adhesive strength between the pre-preg sheet and the copper wiring and, resultantly, could be given a high wiring density. It was found by actual measurement that the resistance to hydrochloric acid was 48 times that of a specimen not subjected to electrolytic reduction and the peeling strength was 1.1 kg/cm$^2$.

EXAMPLE 6

The process of Example 5 was repeated except that polyimide was used in place of epoxy resin used in Example 5 as the organic resin for the substrate and the pre-pregnated sheet and the pH of the electrolytic solution was 6.0. As a result, the wiring board thus obtained showed 50 times as high resistance to hydrochloric acid as that of a specimen not subjected to electrolytic reduction and a peeling strength between the copper wiring and the organic resin of 1.2 kg/cm$^2$. Thus, a multi-layer wiring board having a high-density writing pattern and excellent in both of the characteristics was obtained.

EXAMPLE 7

The process of Example 5 was repeated except that a liquid resist was used in place of the dry film used in Example 5 and the pH of the electrolytic solution was 6.0. As a result, a multi-layer wiring board having a high-density wiring pattern and excellent in resistance to hydrochloric acid and adhesive property was obtained. The resistance to hydrochloric acid was 45 times that of a specimen not subjected to electrolytic reduction and the peeling strength was 1.2 kg/cm$^2$.

EXAMPLE 8

The process of Example 5 was repeated except that an aqueous solution having the composition:

| | |
|---|---|
| KMnO$_4$ | 10 g/l |
| NaOH | 10 g/l | was used as the solution for oxidation treatment of the surface of the copper foil 29 in place of the phosphoric acid type aqueous solution used in Example 5. As a result, a multi-layer wiring board having a high-density wiring pattern and excellent in resistance to hydrochloric acid and adhesive property was obtained. The resistance to hydrochloric acid was 47 times that of a specimen not subjected to electrolytic reduction and the peeling strength was 1.1 kg/cm$^2$.

In the above Examples the resistance to hydrochloric acid and the peeling strength were evaluated in the following manner.

Resistance to hydrochloric acid:

Each specimen was dipped in an aqueous hydrochloric acid solution 17.5% for 1 hour and the width of the oxidized copper film dissolved off by hydrochloric acid was compared with each other. A specimen showing the larger width was judged to be the poorer in the resistance.

Peeling strength:

A conventional, well known method was used. Thus, the copper film was etched to have a width of 10 mm, and a part of the copper film was peeled off. The peeled part and the resin part of the substrate were respectively fixed to the respective jigs of a tensile testing machine and the copper film was peeled off from the resin board at a velocity of 10 cm/min. in vertical direction. The peeling strength was expressed in terms of the stress P (kg) at the time when the film was peeled off per unit width (cm) (namely, P kg/cm).

In the process step shown by FIG. 9(A) in each of above Examples, the copper layer 32 to be formed into the circuit may be applied to the copper foil 29 by electroplating instead of chemical plating. Further, though the use of an insulating substrate 28 onto which copper foil 29 has been hot-pressed was described by way of illustration, there can also be used an insulating substrate onto which thin layer of copper has been applied by chemical plating in place of the copper foil 29.

Further, in each of the above Examples, it was described, by way of illustration, that for each of the single boards to be laminated, the circuit was formed on both sides of the board. However, as occasion demands, the circuit may be formed on one side alone for all or a part of the single boards.

If necessary from the point of circuit design, the outermost surface may have no copper wiring formed thereon.

EXAMPLE 9

Onto a glass-epoxy resin board 28 copper-plated on both sides, copper 32 was thickly plated by chemical plating. Then the surface of copper 32 was treated with a benzotriazole-phosphoric acid type aqueous solution having the composition:

| | |
|---|---|
| Benzotriazole | 100 ppm |
| NaOH | 5 g/l |
| Na$_3$PO$_4$.2H$_2$O | 10 g/l |
| NaClO$_2$ | 30 g/l | to form an oxidized film and a metal-protecting film on the copper surface thereby. After washed with water, the oxidized film was subjected to electrolytic reduction.

Then a resist pattern was formed by using a dry film 31. The copper of the non-circuit part was removed by etching using a ferric chloride type aqueous solution having the composition:

| | |
|---|---|
| FeCl$_3$ | 350 g/l |
| Conc. HCl | 20 ml/l |

Then, the system was treated again with the phosphoric acid type aqueous solution, while the dry film 31 was held on the spot, to form an oxidized film on the side face of the copper wiring. Thereafter, the dry film was peeled off. Then, while one side of the board plated with copper on both sides was being kept in the original state of copper foil, namely the whole face of the one side was masked with a dry film, the other side was plated by chemical plating. Therefore, a substrate was prepared which has been processed by following the successive process steps shown in FIGS. 9(B) to 9(F).

The electrolytic reduction was conducted by using an aqueous NaOH solution (5 g/l) at a current density of 0.2 mA/cm$^2$.

EXAMPLE 10

The process of Example 9 was repeated except for using polyimide as the organic resin for a substrate and a pre-preg sheet in place of epoxy resin used in Example 9. As a result, a multi-layer wiring board having a high-density wiring pattern and excellent in resistance to hydrochloric acid and adhesive property was obtained.

EXAMPLE 11

The process of Example 9 was repeated except that a resin board plated with copper on one side was used in the outermost layer. As a result, a multi-layer wiring board haing a high-density wiring pattern and excellent in resistance to hydrochloric acid and adhesive property was obtained.

EXAMPLE 12

The process of Example 9 was repeated except for using a liquid resist in place of the dry film used in Example 9. As a result, a multi-layer wiring board having a high-density wiring pattern and excellent in resistance to hydrochloric acid and adhesive property was obtained.

EXAMPLE 13

The process of Example 9 was repeated except for using a solution having the composition:

| | |
|---|---|
| KMnO$_4$ | 15 g/l |
| NaOH | 15 g/l | for oxidation treatment of the copper foil surface in place of the phosphoric acid type solution used in Example 9. As a result, a multi-layer wiring board having a high-density wiring pattern and excellent in resistance to hydrochloric acid and adhesive property was obtained.

EXAMPLE 14

The process of Example 9 was repeated except that 1000 ppm of benzotriazole was added to the phosphoric acid type aqueous solution in forming an oxidized film on the copper surface. As a result, a multi-layer wiring board having a high-density wiring pattern and excellent in resistance to hydrochloric acid and adhesive property was obtained.

EXAMPLE 15

The process of Example 9 was repeated except that 1000 ppm of thiodiethylene glycol was added to the phosphoric acid type aqueous solution in place of benzotriazole used in Example 9. As a result, good characteristics were obtained in both resistance to hydrochloric acid and adhesive property.

EXAMPLE 16

Onto a glass-epoxy resin board plated with copper on both sides, copper 32 was thickly plated by chemical plating. Then, the copper surface was treated with a phosphoric acid type aqueous solution having the composition:

| | |
|---|---|
| NaOH | 5 g/l |
| Na$_3$PO$_4$.2H$_2$O | 10 g/l |
| NaClO$_2$ | 30 g/l | to form an oxidized film on the copper surface thereby. After being washed with water, the oxidized film was subjected to electrolytic reduction. The electrolytic reduction was conducted by using an aqueous NaOH solution (5 g/l) at a current density of 0.2 mA/cm$^2$. Then, the surface of the reduced film was treated with a phosphoric acid type aqueous solution having the composition:

| | |
|---|---|
| NaOH | 0.5 g/l |
| Na$_3$PO$_4$ | 1.0 g/l |
| NaClO$_2$ | 3.0 g/l | to form an oxidized film layer 100 Å in thickness thereon.

Then, a resist pattern was formed by using a dry film 31 and then copper 32 of the non-circuit part was removed by etching using a ferric chloride type aqueous solution having the composition:

| | |
|---|---|
| FeCl$_3$ | 40 g/l |
| Conc. HCl | 20 ml/l |

Thereafter, the system was treated again with the phosphoric acid type aqueous solution, while the dry film 31 was being held on the spot, to form an oxidized film on the side face of the copper wiring thereby. The dry film was then peeled off. Thereafter, the system was heated and pressed together with a pre-preg sheet by means of a hot press to cure the pre-preg sheet.

In this Example, one side of the board plated with copper on both sides was kept in the original state of copper foil, namely the whole face of the one side was masked with a dry film and the other side was plated by chemical plating. Thereafter, the successive process steps shown in FIG. 9(B) to 9(F) were conducted to give the substrate.

EXAMPLE 17

The process of Example 16 was repeated except for using polyimide resin as the organic resin for the substrate and the pre-preg sheet in place of the epoxy resin used in Example 16. As a result, a multi-layer wiring board having a high-density wiring pattern and is excellent in resistance to hydrochloric acid and adhesive property was obtained.

EXAMPLE 18

The process of Example 16 was repeated except for using a board plated with copper on single side was used for the outermost layer. As a result, a multi-layer wiring board having a high-density wiring pattern and excellent in resistance to hydrochloric acid and adhesive property was obtained.

EXAMPLE 19

The process of Example 16 was repeated except for using a liquid resist in place of the dry film used in Example 16. As a result, a multi-layer wiring board having a high-density wiring pattern and excellent in resistance to hydrochloric acid and adhesive property was obtained.

EXAMPLE 20

The process of Example 16 was repeated except for using a solution having the composition:

| | |
|---|---|
| $KMnO_4$ | 15 g/l |
| NaOH | 15 g/l | was used for oxidation treatment of the copper foil surface in place of the phosphoric acid type aqueous solution used in Example 16. As a result, a multi-layer wiring board having a high-density wiring pattern and is excellent in resistance to hydrochloric acid and adhesive property was obtained.

EXAMPLE 21

One side of a metallic copper foil of 50 $\mu$m in thickness was roughened by dipping it in a solution containing.

| | |
|---|---|
| $CuCl_2$ | 40 g |
| HCl (35%) | 300 ml | per liter of distilled water at 30° C. for 50 seconds. Then, it was dipped in a solution containing

| | |
|---|---|
| $Na_3PO_4.12H_2O$ | 15 g |
| $NaClO_2$ | 25 g |
| NaOH | 10 g | per liter of distilled water at 70° C. for 120 seconds to form a copper compound layer on the copper foil surface. Then, the resultant layer was electrically reduced by using a solution containing 10 g of NaOH in 1 liter of distilled water at a liquid temperature of 25° C. and a current density of 0.5 $mA/cm^2$. Then, the copper foil whose copper compound layer had been subjected to the reduction treatment was bonded to a pre-preg sheet of a glass clothreinforced polyimide type, the reduction-treated side of the foil being faced to the pre-preg sheet. The bonding was conducted by heating the system at 170° C. and applying a pressure of 25 $kg/cm^2$ for 60 minutes. After completion of the bonding, the adhesive strength of the copper foil to the polyimide resin at room temperature was 1.1 kg/cm, showing a good adhesion.

For evaluating the resistance to hydrochloric acid of the board thus obtained, a part of the bonded board was cut out. The section was polished with polishing paper (#1000) and the board was then dipped in 17.5% hydrochloric acid solution at room temperature. After lapse of 3 hours the copper foil was peeled off to examine the discoloration due to soaking of hydrochloric acid. No discoloration was observed, showing a good resistance to hydrochloric acid. When the copper foil subjected to the reduction treatment was dipped in 1 liter of 17.5% hydrochloric acid into which argon gas had been blown at a rate of 1 l/min. for 1 hour, the reduction-treated film did not disappear completely even after lapse of 30 seconds.

The diffraction pattern obtained by reflection electron diffraction method showed that the principal plane of orientation of the metallic copper foil was (100) plane and that of the reduced film was (100) plane. Further, the presence of trace amount of copper oxide was confirmed in the metallic copper foil and the reduced film.

Examination of the surface roughness of the reduced film showed that $R_z$ was 2 $\mu$m at a standard length $L_2$ of the section of 100 $\mu$m as defined in "surface roughness" according to JIS B 0601.

EXAMPLE 22

The process of Example 21 was repeated except that an epoxy type pre-preg sheet reinforced with glass cloth was used in place of the polyimide type pre-preg sheet reinforced with glass cloth and the bonding was effected at a heating temperature of 170° C., a load of 20 $kg/cm^2$ and a heating time of 80 minutes. The copper-plated epoxy resin board thus bonded showed a peeling strength between the epoxy resin and the copper foil of 1.3 kg/cm and no soaking of hydrochloric acid when dipped in the acid.

The surface roughness of the reduced film was the same as in Example 21. The solubility to hydrochloric acid examined in the same manner as in Example 21 was similar to that in Example 21.

EXAMPLE 23

The process of Example 21 was repeated except that the reduction of the copper compound was conducted at a current density of 2.5 $mA/cm^2$ instead of 0.5 $mA/cm^2$. The bonded, copper-plated epoxy resin board obtained showed a peeling strength between the epoxy resin and the copper foil of 1.2 $kg/cm^2$ and no soaking of hydrochloric acid. Thus, both the peeling strength and the resistance to hydrochloric acid were good. The surface roughness of the reduced film was 1.5 $\mu$m in terms of $R_z$ at a standard length L of the section of 100 $\mu$m as defined in "surface roughness" according to JIS B 0601. The test result of solubility to hydrochloric acid was similar to that in Example 21.

EXAMPLE 24

The process of Example 21 was repeated except that an etching solution containing

| | |
|---|---|
| FeCl$_3$ | 350 g |
| HCl (35%) | 20 ml | in 1 liter of distilled water was used in place of the CuCl$_2$-HCl type etching solution used in Example 20 to roughen the copper foil surface. The bonded, copper-plated epoxy resin board thus obtained showed a peeling strength between the epoxy resin and the copper foil of 1.0 kg/cm$^2$ and no soaking of hydrochloric acid. Thus, both the peeling strength and the resistance to hydrochloric acid were good. The surface roughness of the reduced film was 2.5 μm in terms of R$_z$ at a standard length L of the section of 100 μm as defined in "surface roughness" according to JIS B 0601. The resistance of the film to hydrochloric acid was similar to that in Example 21.

EXAMPLE 25

The process of Example 22 was repeated except that the copper compound layer was formed on the copper foil surface by dipping the surface in a solution containing

| | |
|---|---|
| Cu(CH$_3$COO)$_2$.H$_2$O | 50 g |
| CH$_3$COONH$_4$ | 100 g |
| NH$_4$Cl | 50 g |
| CuSO$_4$ | 5 g |
| NH$_4$OH (28%) | 10 ml | in 1 liter of distilled water at 95° C. for 50 seconds instead of dipping in Na$_3$PO$_4$-NaClO$_2$-NaOH type solution. The bonded, copper-plated epoxy resin board thus obtained showed a peeling strength between the epoxy resin and the copper foil of 1.2 kg/cm$^2$ and no soaking of hydrochloric acid. Thus, both the peeling strength and the resistance to hydrochloric acid were good. The surface roughness of the reduced film was 1.5 μm in terms of R$_z$ at a standard length L of the section of 100 μm as defined in "surface roughness" according to JIS B 0601. The resistance of the film to hydrochloric acid was similar to that in Example 21.

EXAMPLE 26

The process of Example 22 was repeated except that the copper compound layer was formed on the copper foil surface by irradiation of 5000 mJ/cm$^2$ of ultraviolet rays instead of using the Na$_3$PO$_4$-NaClO$_2$-NaOH type solution. The bonded, copper-plated epoxy resin board thus obtained showed a peeling strength between the epoxy resin and the copper foil of 1.1 kg/cm and no soaking of hydrochloric acid. Thus, both the peeling resistance and resistance to hydrochloric acid were good. The surface roughness of the reduced film was 1.8 μm in terms of R$_z$ at a standard length L of the section of 100 μm as defined in "Surface roughness" according to JIS B 0601. The resistance of the film to hydrochloric acid was similar to that in Example 21.

COMPARATIVE EXAMPLE 4

The process of Example 21 was repeated except that after the copper compound layer had been formed on the copper foil surface, the copper foil was bonded to a polyimide-type pre-preg sheet reinforced with glass cloth, the copper compound layer being faced to the pre-preg sheet. The bonded, copper-plated polyimide board thus obtained gave a peeling strength between the polyimide resin and the copper foil of 1.3 kg/cm, showing thus an excellent peeling strength characteristic. However, it gave a distance of soaking of hydrochloric acid from the side face of 120 μm, showing a poor resistance to hydrochloric acid. The surface roughness of the reduced film was 1.5 μm in terms of R$_z$ at a standard length L of the section of 100 μm as defined in "surface roughness" according to JIS B 0601.

Examination of the solubility to hydrochloric acid conducted in the same manner as in Example 21 showed that the copper compound layer dissolved completely in 5 seconds.

COMPARATIVE EXAMPLE 5

The process of Example 21 was repeated except that the copper compound layer was reduced chemically by using a solution containing 200 ml of 37% HCHO solution per liter instead of being reduced electrochemically as in Example 21. The surface appearance of the reduced copper foil had a copper color with no gloss. The bonded, copper-plated polyimide board thus obtained gave a peeling strength between the polyimide resin and the copper foil of less than 0.1 kg/cm$^2$, showing thus a poor peeling strength characteristic. However, no soaking of hydrochloric acid from the side face was observed. The surface roughness of the reduced film was 0.5 μm in terms of R$_z$ at a standard length L of the section of 100 μm as defined in "surface roughness" according to JIS B 0601.

The solubility to hydrochloric acid examined in the same manner as in Example 21 was similar to that in Example 21.

As described in the foregoing, according to this invention, an adhesion of copper foil to resin can be obtained which has a peeling strength of 0.3 kg/cm or more and an excellent resistance characteristic to hydrochloric acid even when the ruggedness of the copper foil surface is kept down to a low level (R$_z$ of 6 μm or less at a standard height L of the section of 100 μm as defined in "surface roughness" according to JIS B 0601).

EXAMPLE 27

The process of Example 21 was repeated except for using a glass cloth-reinforced epoxy prepreg in place of the glass cloth-reinforced polyimide prepreg, and the adhesion was conducted at a heating temperature of 160° C., a load of 18 kg/cm$^2$ and a heating time of 80 minutes. The copper-plated epoxy resin board thus bonded showed a peeling strength between the epoxy resin and the copper foil of 1.5 kg/cm and no soaking of hydrochloric acid when dipped in the acid.

EXAMPLE 28

The process of Example 21 was repeated except for using a glass cloth-reinforced polyester prepreg in place of the glass cloth-reinforced polyimide prepreg, and the adhesion was conducted at a heating temperature of 170° C., a load of 20 kg/cm$^2$ and a heating time of 50 minutes. The copper-plated polyester resin board thus bonded showed a peeling strength between the polyester resin and the copper foil of 1.2 kg/cm$^2$ and no soaking of hydrochloric acid when dipped in the acid.

What is claimed is:

1. A composite of metal and resin comprising a resin layer having metal adjacent thereto, said metal comprising a base metal layer, and formed on said base metal layer an electrolytically reduced metal layer having a surface roughness of a degree giving (a) a lusterless appearance, the degree of the lusterlessness being 50% or less in terms of direct reflectivity as determined in a wavelength range of 600 to 700 nm, and (b) a color of olive brown to black, said color having a hue in a range of from 7.5 RP to 7.5 Y, a value of 7 or less, and a chroma of 12 or less as determined according to Munsell Book of Color, closely adhered through said surface to the resin layer.

2. A composite of metal and resin according to claim 1, wherein the degree of said lusterlessness and color is 20% or less in terms of direct reflectivity as determined in a wavelength range of 600 to 700 nm.

3. A composite of metal and resin according to claim 1, wherein said color has a hue in a range of from 10 RP to 2.5 Y, a value of 6 or less, and a chroma of 8 or less as determined according to Munsell Book of Color.

4. A composite of metal and resin according to claim 1, wherein said base metal is an alloy comprising copper as the principal component or a product formed by diffusing one or more other elements into copper.

5. A composite of metal and resin according to claim 1, wherein said electrolytically reduced metal layer comprises a metal layer formed by electrolytically reducing a metal oxide layer.

6. A composite of metal and resin according to claim 5, wherein said metal oxide layer was formed by oxidizing at least a portion of a layer of the metal.

7. A composite of metal and resin according to claim 1, wherein the resin layer is a glass-cloth-reinforced polyimide or epoxy prepreg sheet.

8. A composite of metal and resin according to claim 1, wherein said electrolytically reduced metal layer is a metal layer formed by electrolytically reducing a metal oxide layer using an electrolyte having a pH of at least 6.

9. A composite of metal and resin comprising a base metal having a first rugged part as the surface thereof, an electrolytically reduced metal forming a second rugged part covering the surface of the first rugged part along the rugged surface more thinly and with a more finely rugged surface than the first rugged part is, thereby providing a surface resistant to acids and to which a resin layer can adhere, and a resin layer closely adhered to the surface of the second rugged part.

10. A composite of metal and resin according to claim 9, wherein the surface roughness of the said first rugged part is 6 μm or less in terms of $R_z$ at a standard length L of 100 μm as defined in JIS B 0601.

11. A composite of metal and resin according to claim 9, wherein the film thickness (minimum width) of the said second rugged part is 70 Å or more and is equal to or less than the surface roughness of the said first rugged part.

12. A composite of metal and resin according to claim 9, wherein the surface of the said second rugged surface is lusterless, the degree of the lusterlessness being 50% or less in terms of direct reflectivity as determined in a wavelength range of 600 to 700 nm, and has a color of olive brown to black, said color having a hue in a range of form 7.5 RP to 7.5 Y, a value of 7 or less, and a chroma of 12 or less as determined according to Munsell Book of Color.

13. A composite of metal and resin according to claim 9, wherein said metal is copper or an alloy comprising copper as the principal component.

14. A composite of metal and resin according to claim 9, wherein said resin is polyimide.

15. A composite of metal and resin according to claim 9, wherein said electrolytically reduced metal layer comprises a metal layer formed by electrolytically reducing a metal oxide layer.

16. A composite of metal and resin according to claim 15, wherein said metal oxide layer was formed by oxidizing at least a portion of a layer of the metal.

17. A composite of metal and resin comprising a resin layer and a metal layer, obtained by electrolytic reduction of a metal compound layer to provide a finely rugged surface that is lusterless, the degree of the lusterlessness being 50% or less in terms of direct reflectivity as determined in a wavelength range of 600 to 700 nm, and that has a color of olive brown to black, said color having a hue in a range of from 7.5 RP to 7.5 Y, a value of 7 or less, and a chroma of 12 or less as determined according to Munsell Book of Color, said metal compound layer having been formed by reacting at least a surface portion of an initial metal layer to form said metal compound layer, said metal layer being closely adhered to the resin layer.

18. A composite of metal and resin according to claim 17, wherein said metal layer is formed of copper or comprises copper as the principal component.

19. A composite of metal and resin according to claim 17, wherein the said metal layer is a reduced metal layer containing metal oxide.

20. A composite of metal and resin according to claim 17, wherein the said metal layer forms a wiring part and the said resin layer forms a substrate for a printed circuit board on which the wiring part is wired and which supports and insulates the wiring part.

21. A composite of metal and resin according to claim 17, wherein said resin is a polyimide.

22. A composite of metal and resin according to claim 17, wherein said metal compound is a metal oxide.

23. A composite of metal and resin according to claim 22, wherein said metal layer is obtained by electrolytic reduction in an electrolyte having a pH of at least 6.

24. A composite of metal and resin comprising at least one resin board substrate, at least one base metal layer formed on at least one surface of said substrate, at least one reduced metal layer which is provided on the base metal layer and is obtained by electrolytic reduction of an oxidized metal film, and at least one resin layer closely adhered onto said reduced metal layer.

25. A composite of metal and resin according to claim 24, wherein the said base metal layer and the said reduced metal layer are formed of the same kind of metal with each other.

26. A composite of metal and resin according to claim 24, wherein the said base metal layer and the said reduced metal layer are different from each other in crystal structure and shape.

27. A composite of metal and resin according to claim 24, wherein the said reduced metal layer contains metal oxide remaining therein.

28. A composite of metal and resin according to claim 24, wherein the said base metal layer and the said reduced metal layer are integrated into one body to form wiring, and are laminated and bonded with the resin.

29. A composite of metal and resin according to claim 25, wherein said metal is copper or comprises copper as the principal component.

30. A composite of metal and resin according to claim 29, wherein the resin is a polyimide.

31. A composite of metal and resin according to claim 24, wherein the surface of said at least one base metal layer forms a first rugged part, an electrolytically reduced metal forming a second rugged part covers the surface of the first rugged part along the rugged surface more thinly and with a more finely rugged surface than the first rugged part is, and said at least one resin layer is closely adhered to the surface of the second rugged part.

32. A composite of metal and resin according to claim 31, wherein the surface roughness of said first rugged part is 6 μm or less in terms of $R_z$ at a standard length L of 100 μm as defined in JIS B 0601.

33. A composite of metal and resin according to claim 31, wherein the film thickness (minimum width) of the said second rugged part is 70 Å or more and is equal to or less than the surface roughness of the said first rugged part.

34. A composite of metal and resin according to claim 31, wherein the surface of the said second rugged surface is lusterless, the degree of the lusterlessness being 50% or less in terms of direct reflectivity as determined in a wavelength range of 600 to 700 nm, and has a color of olive brown to black, said color having a hue in a range of from 7.5 RP to 7.5 Y, a value of 7 or less, and a chroma of 12 or less as determined according to Munsell Book of Color.

35. A composite of metal and resin comprising a resin board substrate, a base metal layer formed on at least one surface of the substrate, an electrolytically reduced metal layer formed on the base metal layer and having a surface roughness of a degree giving a lusterless appearance, the degree of the lusterlessness being 50% or less in terms of direct reflectivity as determined in a wavelength range of 600 to 700 nm, and a color of olive brown to black, said color having a hue in a range of from 7.5 RP to 7.5 Y, a value of 7 or less, and a chroma of 12 or less as determined according to Munsell Book of Color, and a circuit conductor adhered to said surface of the reduced metal layer.

36. A composite of metal and resin according to claim 35, wherein the resin board substrate is a glass fiber-reinforced epoxy resin or polyimide resin.

37. A composite of metal and resin according to claim 35, wherein the base metal layer and the reduced metal layer are different from each other in crystal structure and shape.

38. A composite of metal and resin according to claim 35, wherein the reduced metal layer contains metal oxide remaining therein.

39. A composite of metal and resin according to claim 35, wherein the metal of the base metal layer is copper or a copper compound containing copper as a principal component.

40. A composite of metal and resin, formed by the process of closely adhering a reduced metal layer, obtained by electrolytic reduction of an oxidized metal film surface, to a resin layer, the reduced metal layer providing a surface to which the resin layer can adhere and being resistant to acids.

* * * * *